United States Patent [19]

Murray et al.

[11] Patent Number: 4,544,886
[45] Date of Patent: Oct. 1, 1985

[54] CIRCUIT BOARD TEST FIXTURE

[75] Inventors: John D. Murray, Milpitas; Sydney J. Weiss, Scotts Valley, both of Calif.

[73] Assignee: M-Rel, Inc., Milpitas, Calif.

[21] Appl. No.: 428,701

[22] Filed: Sep. 30, 1982

[51] Int. Cl.4 ............................................ G01R 31/02
[52] U.S. Cl. .............................. 324/158 F; 324/73 PC
[58] Field of Search ............ 324/158 F, 158 P, 73 PC

[56] References Cited

U.S. PATENT DOCUMENTS

| 4,138,186 | 2/1979 | Long et al. ...................... 324/158 P |
| 4,344,033 | 8/1982 | Stowers et al. ................. 324/158 P |
| 4,403,822 | 9/1983 | Smith ............................... 324/158 P |

Primary Examiner—Ernest F. Karlsen
Assistant Examiner—Kevin D. O'Shea
Attorney, Agent, or Firm—Thomas E. Schatzel

[57] ABSTRACT

A circuit board test fixture has a mount with slots for loosely receiving the marginal edges of a diaphragm. Sealing surfaces curve downwardly from the slots for the diaphragm to form a direct seal against when drawn tightly thereabout. Innermost faces of the mount are spaced outwardly from the marginal edges of a backing plate that supports the diaphragm and moves perpendicular thereto. The mount projects upwards from a vacuum chamber base that is hingedly connected to a connector housing. The mount will maintain a seal with the diaphragm for an operative vacuum chamber when the base is pivoted upwardly to almost an upright position.

10 Claims, 8 Drawing Figures

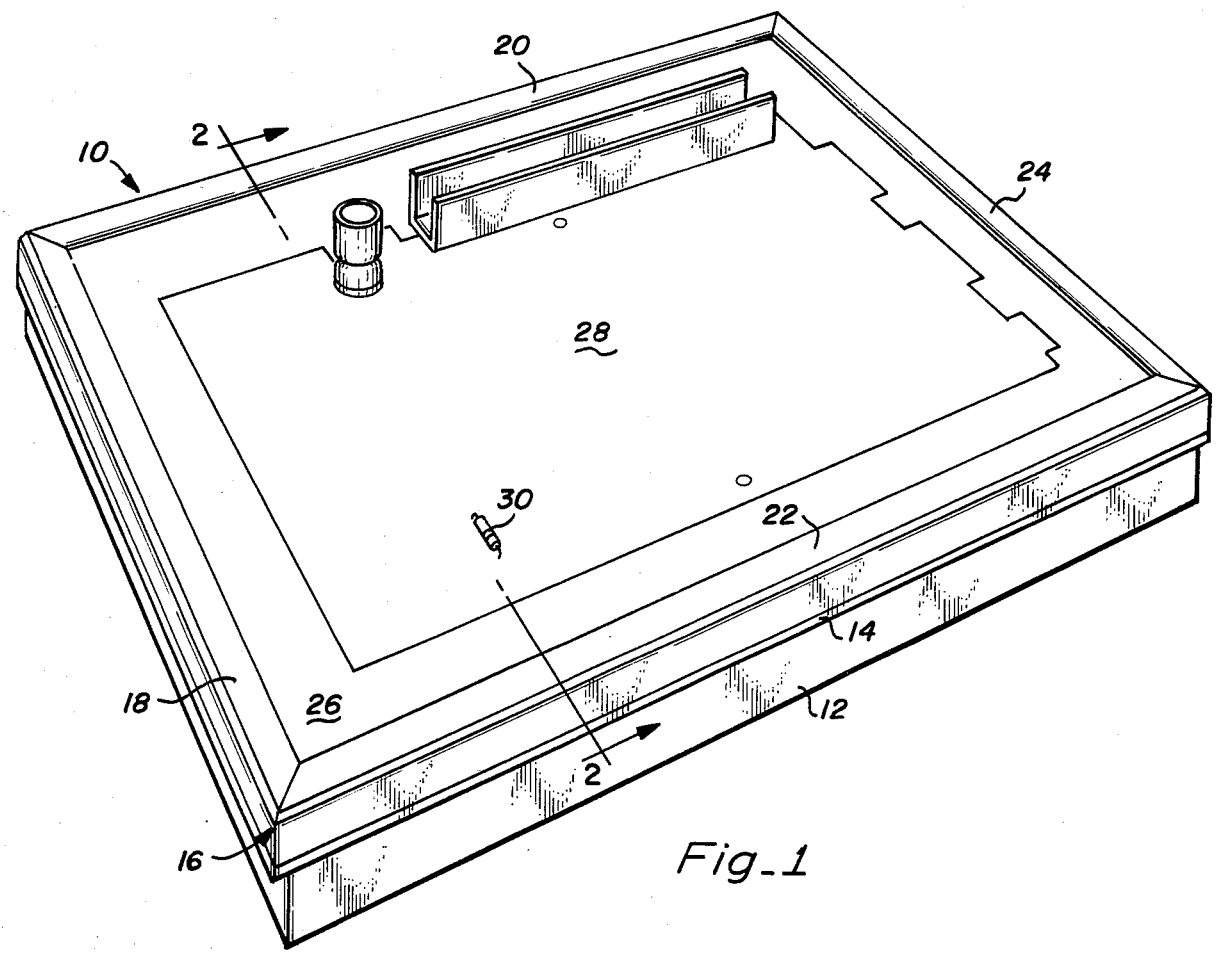
Fig_1
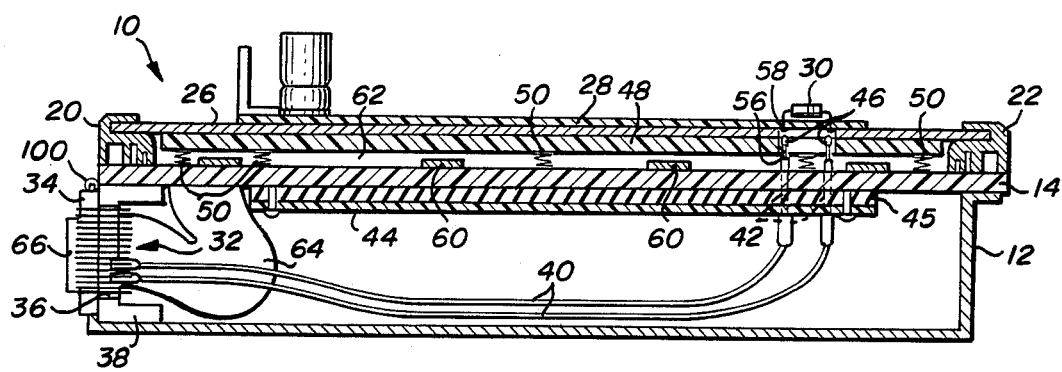
Fig_2

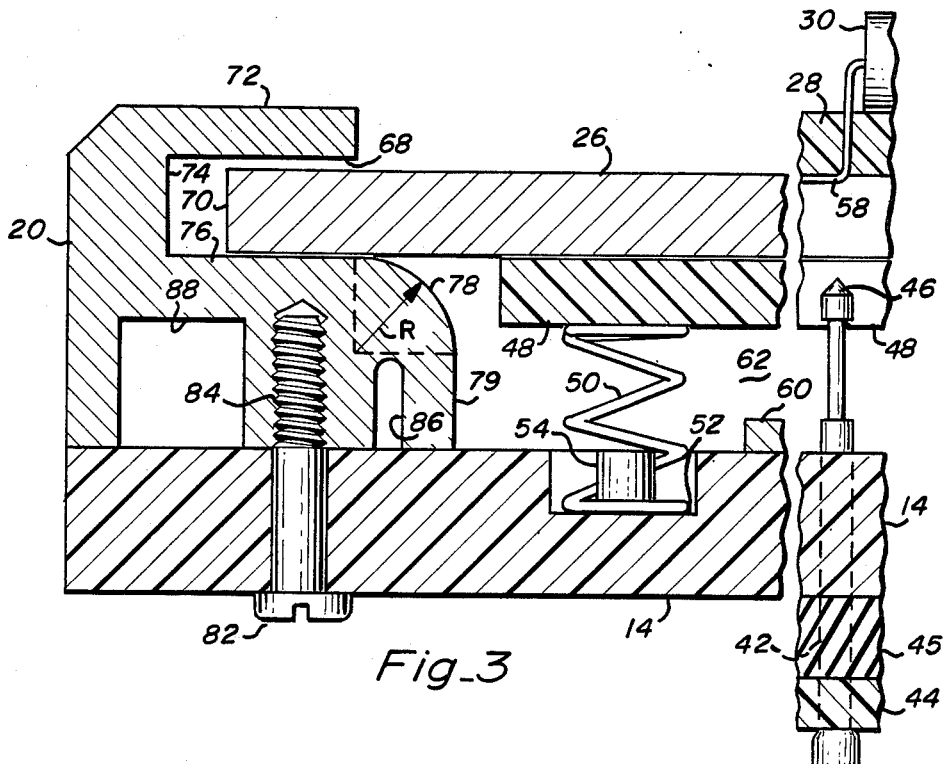
Fig_3
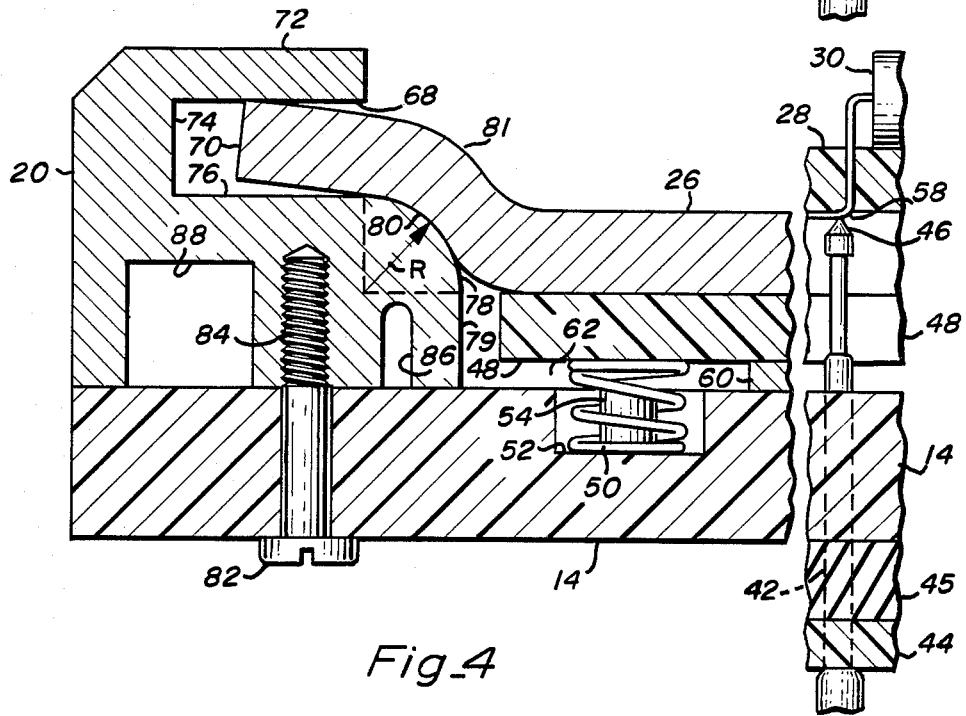
Fig_4

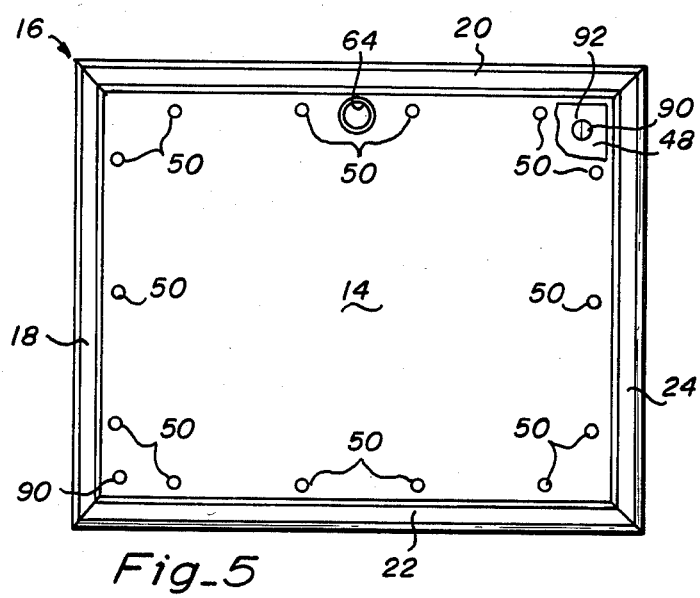
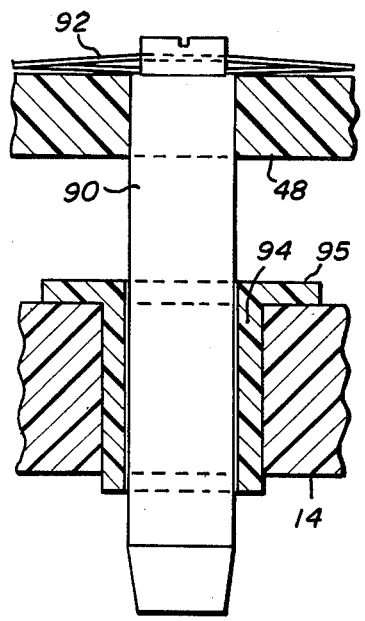
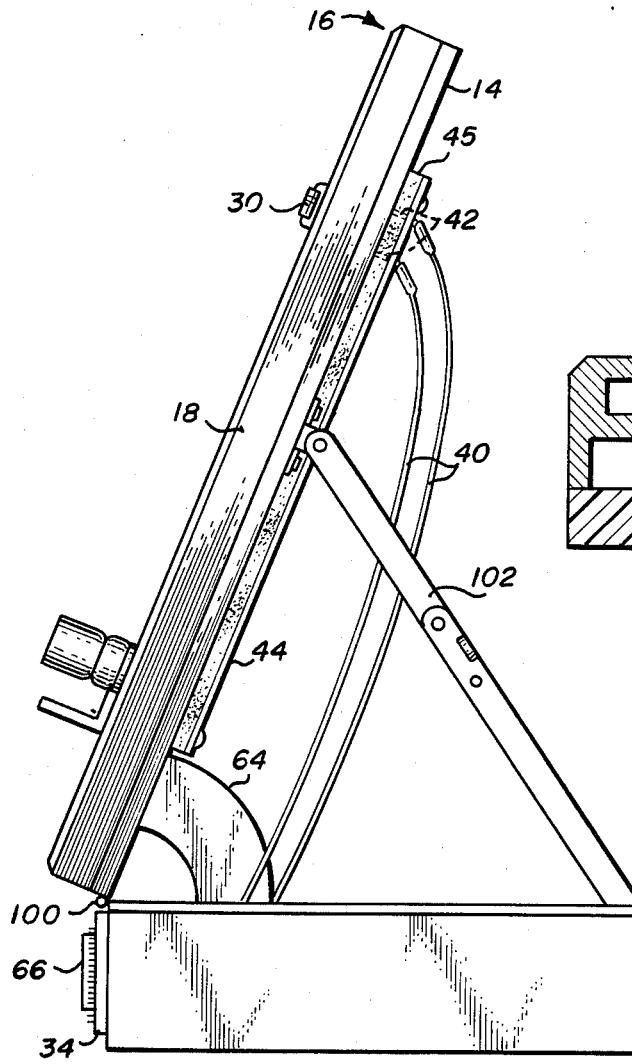

CIRCUIT BOARD TEST FIXTURE

BACKGROUND OF THE INVENTION

1. Field of the Invention

This invention relates generally to a circuit board test fixture. More specifically, it concerns a vacuum operated fixture having a flexible diaphragm for moving a circuit board into testing engagement with electrical probes.

2. Description of the Prior Art

Known vacuum operated test fixtures require extensive disassembly for removal of a diaphragm and a backing plate from the fixture top to replace or clean probes. Removing screws, stripping retainers, and then replacing the retainers and screws can be time consuming. A tester requiring screw and retainer removal before diaphragm and plate removal is disclosed in U.S. Pat. No. 4,017,793 of Fred E. Haines. This patent also discloses a vacuum chamber base member that is adapted to be pivoted upwardly for easy working with electrical contacts and other parts within a dust cover. When elastomeric foam is used for a diaphragm, it should not be bent sharply or compressed as to disfigure the foam. Such bending and compression causes excessive wear, deterioration of the foam and susceptibility to tear. Thus, the diaphragm should be maintained with minimal stress, but must form an air-tight seal at the fixture top for maintaining a pressure differential on opposite sides of the diaphragm.

Back-up plates have been sealed between a diaphragm and a head plate by cementing the peripheral edges of the diaphragm to the head plate. A rectangular frame fits about the peripheral edges of the diaphragm, and the frame and the head plate fit within guide rails. Such structure is disclosed in U.S. Pat. No. 4,138,186 of Everett J. Long, et al. This patent also discloses, as prior art, an arrangement wherein the peripheral edges of a sealing member fit within slots in a picture frame shaped housing. An inclined sealing surface at the bottom of the slot is engaged by the sealing member when a vacuum chamber is evacuated. An upper flange, defining the top of the slot, overlaps both the sealing member and a backing member, making removal of the backing member difficult.

A test jig for contacting circuit card positions is disclosed in U.S. Pat. No. 3,016,489 of T. H. Briggs, et al. A flexible diaphragm element that is fastened within a housing is located beneath peg-like plungers or pins. Air or hydraulic pressure forces the diaphragm upward to contact the plungers or pins, forcing probe assemblies into contact with the circuit card. Mounting channels receive the circuit card that is clamped therein by a top mounting channel molding clamp. Other circuit board test equipment is disclosed in U.S. Pat. No. 3,757,219 of Akin Aksu, U.S. Pat. No. 3,714,572 of Jack Wesley Ham, et al., and British patent specification No. 1,297,377 of Edwin Albert Quincey, et al.

SUMMARY OF THE INVENTION

An object of the present invention is to provide a circuit board test fixture with a diaphragm and a backing plate that can be removed readily from the top of the fixture for access to clean or replace probe heads.

Another object of the invention is to provide a mount for loosely retaining the marginal edges of a diaphragm and for forming a direct seal with the diaphragm in response to pressure differential.

A further object of the invention is to provide a vacuum chamber base that is hingedly connected to a connector housing and a mount that will maintain an operative vacuum chamber when the base is pivoted upwardly to almost an upright position.

In accordance with the present invention, there is provided a circuit board test fixture having a base. A plate is resiliently mounted in spaced relationship above the base for movement perpendicular to the base. A diaphragm is supported upon the plate for carrying a circuit board to be tested. The plate and the diaphragm have internal cut-out portions. Electrical probes, supported by the base, extend into the cut-out portions of the plate and diaphragm. Means for creating a differential pressure acting upon the diaphragm moves the diaphragm and plate towards the base and brings the circuit board to be tested into engagement with the electrical probes. Both the plate and the diaphragm have marginal edges extending laterally outward beyond the plate edges. A mount projects upwardly from the base about the marginal edges of the plate. The mount has slots therein for loosely receiving the marginal edges of the diaphragm. Sealing surfaces on the mount curve downwardly from the slots for the diaphragm to form a direct seal against when the diaphragm is drawn tightly about the sealing surfaces. Innermost faces of the mount are spaced outwardly from the marginal edges of the plate.

Advantages of the circuit board test fixture of the present invention include ready access for cleaning or replacing probes, a mount that holds the diaphragm in an unstressed condition until a pressure differential causes the diaphragm to form a direct seal with the mount, and a mount that will maintain an operative vacuum chamber when the base thereof is pivoted upwardly to almost an upright position.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWING

FIG. 1 is a perspective view of a circuit board test fixture embodying the present invention;

FIG. 2. is a section in elevation taken on the line 2—2 of FIG. 1;

FIG. 3 is a detail view of a vacuum chamber at atmospheric pressure.

FIG. 4 is a detail view of the vacuum chamber in an evacuated condition.

FIG. 5 is a plan view of the circuit board test fixture with portions broken away to show underlying structure.

FIG. 6 is a detail view of a guide pin projecting from a plate through a teflon bushing in a base.

FIG. 7 is a detail view illustrating a marginal edge of a diaphragm withdrawn from its mount slot.

FIG. 8 is an end view of the circuit board test fixture illustrating a vacuum chamber base pivoted upwardly to almost an upright position.

DETAILED DESCRIPTION OF THE PREFERRED EMBODIMENT

Looking now at FIG. 1, a circuit board test fixture embodying the present invention is indicated by general reference numeral 10. This fixture has a box-like connector housing 12 and a vacuum chamber base 14 hingedly mounted as a cover thereon. Projecting upwardly from the base is a mount, indicated by general reference numeral 16 and formed by guide rails 18, 20, 22 and 24. A diaphragm 26, made of elastomeric foam material sealed on both sides, is loosely retained about its marginal edges by the mount. Carried by the diaphragm is a circuit board 28 to be tested. While a multitude of components can be mounted on the circuit board, only one component 30 has been shown for simplification.

With reference to FIG. 2, a set of interface pins, indicated by general reference numeral 32, project from a mounting block 34 through an opening 36 into the connector housing 12. The mounting block is mounted to an interface support 38. The ends of the interface pins on the outside of the mounting block can be connected by an interface assembly to a data processing apparatus for analyzing the electrical continuity of the circuit board 28. The inner ends of the interface pins are connected by wires 40 to probes 42. The probes extend through base openings that are sealed with the probes in place so that the base is air-tight. A ground plane 44 is attached to the base 14 for shielding purposes, and when extra holes are drilled in the base, such holes are sealed by a diaphragm 45. This diaphragm is a prurom rubber mat. When the probes are removed, the rubber closes up behind the probe making a seal. The probes are of a spring-loaded plunger type having heads 46 that retract under pressure.

A plate 48 is resiliently mounted in spaced relationship above the base 14 by coil springs 50 abutting the lower side of the plate and having their lower ends in recesses 52 (FIGS. 3 and 4) about a post 54. The springs permit the plate to move perpendicular to the base. The plan arrangement of springs about the base is shown in FIG. 5. Diaphragm 26 is supported upon the upper side of the plate and carries the circuit board 28. The plate and the diaphragm have internal cut-out portions 56, that register beneath wiring connections 58 for the component 30, allowing the probe heads 46 to extend therein. Fixed to the upper surface of the base are elastomeric stop pads 60 which limit the downward movement of the plate and assure a vacuum chamber and passage along the top of the base. The stop pads are the same height as a teflon bushing 94, that will subsequently be described, so when the plate 48 is sucked down, the plate stays flat. A vacuum chamber 62 is formed beteen the diaphragm and the base. This chamber is connected to a vacuum source by a flexible conduit 64 extending through a bore in the base to a source connection 66 that projects from the connector housing 12.

Referring now to FIGS. 3 and 4, guide rail 20 is typical of all rails in the mount 16. Each rail has a slot 68 for loosely receiving a marginal edge 70 of the diaphragm 26. The depth of the slot, measured perpendicular to the base, is slightly greater than the thickness of the diaphragm, and the slot extends laterally into the rail, parallel to the base, by a dimension twice the slot depth. The slot is defined by a horizontal flange 72, a vertical web 74 and a horizontal seat 76. Curving downwardly from the seat at the end of the slot is a sealing surface 78 that extends through a quadrant to an innermost face 79 of the rail. The sealing surface has a radius of curvature R that is greater than the thickness of the diaphragm to prevent sharp bending of the diaphragm.

Since the diaphragm thickness is but slightly less than the radius of curvature, when the diaphragm is bent tightly about the sealing surface, the diaphragm area 80 adjacent the sealing surface is substantially smaller than the area 81 of the diaphragm side opposite therefrom. Thus, atmospheric pressure applied to the diaphragm surface area 81 on the outside of the curve, readily overcomes the partially evacuated pressure on the diaphragm surface area 80 at the inside of the curve.

It will be noted that the innermost face 79 of the rail 20 is spaced outwardly from the marginal edge of the plate 48, allowing the plate to move vertically without interference. As shown in FIG. 3, the horizontal seat 76 defining the bottom of the slot 68 is located at about the same level as the upper surface of the plate, so that the diaphragm 26 extends from the plate to the slot without bending. The rail is fastened to the base 14 by machine screws 82 fitting through the base into a serrated edge groove 84. Diametrically opposed screw threads mesh with edge serrations as the groove extends upwardly from the base. The transverse cross-section of the groove is as shown in FIGS. 3 and 4, and the groove extends for the full length longitudinally of the rail. Grooves 86 and 88 are provided in the rail to reduce the weight of material used when the rail is formed by an aluminum extrusion methods.

As shown in FIG. 5, a pair of guide pins 90 are located near diagonally opposite corners of the base 14. These guide pins fit through the plate 48, as shown in FIG. 6. A pull ring 92 is fastened through a bore in the head of the pin above the upper surface of the plate. The pin projects downwardly from the plate through a teflon bushing 94 that is mounted within the base and that acts as a self lubricated guide and seal. The bushing has a radial flange 95 that contacts the plate, when the plate is sucked down, to form an air tight seal. Thus, the plate is aligned in registration with the base when the two guide pins projecting downwardly from the plate fit within the teflon bushings in the base. The plate is removed from the base by lifting upward on the pull rings.

With reference to FIG. 7, the marginal edge 70 of the diaphragm 26 can be withdrawn from the rail slot 68 by pinching the diaphragm as to form an upward wrinkle 96 or by compressing a diaphragm portion as indicated by reference numeral 98. The circuit board 28 is normally removed before withdrawing the diaphragm from the rail slots. Conventional positioning and locking pins, not shown, are provided for aligning the circuit board in registration with the plate 48 and the base 14.

As shown in FIG. 8, a hinge 100 connects the base 14 to the connector housing 12, enabling the base to be pivoted upwardly to the almost upright position shown. A foldable brace linkage 102 locks in the position shown for maintaining this base position while de-bugging and troubleshooting problems. The wires 40 can remain interfaced with the probes 42 and vacuum can be applied through the flexible conduit 64, while the diaphragm 26 maintains sealing engagement with the sealing surfaces 78 of the mount 16.

In operation, a circuit board 28 is positioned on the test fixture 10, as shown in FIG. 3. As the vacuum chamber 62 is evacuated, the plate 48 moves downwardly towards the base. The diaphragm 26 is cemented to the plate around the cut-out portions 56, and moves downwardly with the plate, while the marginal edges 70 pivot upward in the slots 68 until contact is made with the horizontal flanges 72. This contact limits further upward pivoting of the diaphragm, while further downward plate movement causes the diaphragm to be drawn tightly about the sealing surfaces 78. Thus, the diaphragm forms a direct seal against the sealing surfaces as shown in FIG. 4. In this position, the probe heads 46 contact the wiring connections 58 and the circuit board can be tested.

If troubleshooting is necessary, the vacuum chamber base 14 can be pivoted upwardly to the position shown in FIG. 8 for checking wiring problems. To check for problems such as dirty or broken probe heads 46, the base is lowered to the connector housing 12 and the vacuum source is disconnected. The circuit board 28 is removed. The marginal edges 70 of the diaphragm 26 are withdrawn from the slots 68, and the pull rings 92 of the plate 48 are lifted to remove the plate and the diaphragm. Thus, access is provided for cleaning or replacing probe heads.

The interface means, such as interface pins 32, mounting block 34, opening 36, and interface support 38 can be varied to accommodate various kinds of data processing equipment.

From the foregoing description, it will be seen that the circuit board test fixture 10 has a diaphragm 26 and a backing plate 48 that can be removed readily from the top of the fixture for access to clean or replace the probe heads 46. The marginal edges 70 of the diaphragm are loosely retained within the slots 68 of the mount 16, and the diaphragm forms a direct seal with the sealing surfaces 78 of the mount when drawn tightly thereabout. The vacuum chamber base 14 is hingedly connected to the connector housing 12 and the mount will maintain an operative vacuum chamber when the base is pivoted upwardly to almost an upright position.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

We claim:

1. In a circuit board test fixture having a base, a plate resiliently mounted in spaced relationship above the base for movement perpendicular to the base, a diaphragm supported upon the plate for carrying a circuit board to be tested, said plate and said diaphragm having at least one internal cut-out portion, electrical probes supported by the base extending into the cut-out portions of the plate and diaphragm, means for creating differential pressure acting upon the diaphragm to move the diaphragm and plate towards the base bringing the circuit board to be tested into engagement with the electrical probes, said plate and said diaphragm having marginal edges with the diaphragm marginal edges being spaced outward laterally beyond the plate marginal edges, and the improvement comprising a mount having slots therein for loosely receiving the marginal edges of the diaphragm that can be withdrawn from the slots by pinching the diaphragm to move the marginal edges towards the center of the diaphragm, sealing surfaces curving downwardly from the slots for the diaphragm to form a direct seal against when drawn tightly thereabout, and inner most faces that are spaced outwardly from the marginal edges of the plate, whereby said diaphragm and said plate can be readily removed upwardly from the base to provide access for cleaning the electrical probes while the mount remains fixed to the base.

2. The circuit board test fixture described in claim 1 wherein said mount sealing surfaces have a radius of curvature that is greater than the thickness of the diaphragm.

3. The circuit board test fixture described in claim 2 wherein said diaphragm thickness is but slightly less than the radius of curvature of the mount sealing surfaces so that when the diaphragm is bent tightly about the sealing surfaces, the diaphragm area adjacent the sealing surfaces is substantially smaller than the area of the diaphragm side opposite therefrom.

4. The circuit board test fixture described in claim 1 wherein said mount slots and said plate are located at about the same level when there is no pressure differential acting upon the diaphragm so that the diaphragm extends from the plate to the slot without bending.

5. The circuit board test fixture described in claim 1 wherein said mount slots have a depth measured perpendicular to the base that is slightly greater than the thickness of the diaphragm, and said slots extend parallel to the base and laterally into the mount by a dimension more than twice the diaphragm thickness.

6. The circuit board test fixture described in claim 1 wherein said mount has serrated edged grooves extending upwardly from the base for receiving screws to fasten the mount to the base.

7. The circuit board test fixture described in claim 6 wherein said mount has additional grooves extending upwardly from the base to reduce the weight of material within the mount.

8. The circuit board test fixture described in claim 1 wherein the base, the plate and the picture-frame shaped mount have rectangular configurations.

9. The circuit board test fixture described in claim 1 wherein said plate carries a plurality of guide pins that project downwardly from the plate, and said base carries a plurality of teflon bushings for receiving the guide pins.

10. The circuit board test fixture described in claim 1 wherein said base is hingedly connected to a connector housing thereby providing access to the underside of the base and the interior of the connector housing.

* * * * *